(12) United States Patent
Matias

(10) Patent No.: US 7,906,956 B2
(45) Date of Patent: Mar. 15, 2011

(54) POLARITY TESTER FOR AN ELECTRONIC COMMUNICATION PORT

(76) Inventor: Filipe P. Matias, Urgueira (PT)

( * ) Notice: Subject to any disclaimer, the term of this patent is extended or adjusted under 35 U.S.C. 154(b) by 316 days.

(21) Appl. No.: 12/228,109

(22) Filed: Aug. 8, 2008

(65) Prior Publication Data

US 2009/0045802 A1 Feb. 19, 2009

Related U.S. Application Data

(60) Provisional application No. 60/955,430, filed on Aug. 13, 2007.

(51) Int. Cl.
*G01R 19/14* (2006.01)
*G01R 31/02* (2006.01)

(52) U.S. Cl. .................... 324/133; 324/72.5

(58) Field of Classification Search .............. 324/133, 324/76.11, 72.5, 555, 556, 509, 538; 340/663, 340/662, 660, 657, 540, 500, 664

See application file for complete search history.

(56) References Cited

U.S. PATENT DOCUMENTS

| | | | | |
|---|---|---|---|---|
| 3,851,243 A * | 11/1974 | Banner | | 324/508 |
| 4,111,516 A * | 9/1978 | Wireman | | 439/490 |
| 5,270,638 A * | 12/1993 | Mellott | | 324/133 |
| 6,433,530 B1* | 8/2002 | Pool | | 324/72.5 |
| 2002/0057089 A1* | 5/2002 | Brown | | 324/508 |
| 2006/0028194 A1* | 2/2006 | Bosch | | 324/72.5 |

* cited by examiner

*Primary Examiner* — Hoai-An D Nguyen
(74) *Attorney, Agent, or Firm* — Jacobson and Johnson; Thomas N. Phung

(57) ABSTRACT

A polarity tester is engagable with an electronic communication port to test the polarity thereof. A connector is supported on a housing and features a plurality of electrical contacts for placement into electrical connection with a respective plurality of electrical contacts in the communication port when the connector is selectively engaged therewith. The plurality of electrical contacts include a power supply contact and a ground contact and a conductive path is defined within the housing to extend between the power supply and ground contacts. An indicator is connected within the conductive path to provide to a user of the polarity tester, when the connector is engaged with the communication port, an indication of whether electricity flows into the conductive path from the respective plurality of electrical contacts in the communication port through the power supply contact.

18 Claims, 4 Drawing Sheets

POLARITY TESTER FOR AN ELECTRONIC COMMUNICATION PORT

This application claims the benefit under 35 U.S.C. 119(e) of U.S. provisional application Ser. No. 60/955,430, filed Aug. 13, 2007.

FIELD OF THE INVENTION

The present invention relates generally to a polarity tester engagable with an electronic communication port to test the polarity thereof.

BACKGROUND OF THE INVENTION

Universal serial bus (USB) ports are presently included as standard equipment on personal computers and have become so widely used by various computer-related electronic devices that computer case manufacturers have begun including them in various positions, most typically at the front or side panel of a case, distal from where the motherboard is later installed. Cases equipped with these extra USB ports make use of a cable and connector(s) that are manually connected between the motherboard USB header and the port by the system builder. These connectors and ports are often not keyed to ensure that the connector is engaged with the port in the proper orientation to establish the proper connection of each contact of the port with the correct respective pin on the motherboard. As a result, it is possible that the builder may engage the connector with the port in a reverse orientation where the power supply and ground pins of the USB header are inadvertently connected to the ground and power supply contacts of the USB port respectively, the polarity of the USB port thereby being reversed from what it should be.

Connection of a peripheral device to a USB port improperly connected as described above can result in permanent and fatal damage to the motherboard, the USB port or the peripheral equipment connected thereto. A user having plugged in a USB device to a personal computer to discover that the device does not work thereafter may assume that the device is faulty and return the product for warranty service or discard it and purchase new equipment, not realizing that the problems resides in the computer and not the device being connected thereto.

Therefore, it would be desirable to have a polarity tester adapted for use with a computer's communication port to allow a user to test the polarity of the communication port before connecting peripheral equipment thereto.

SUMMARY OF THE INVENTION

According to a first aspect of the invention there is provided a polarity tester engagable with an electronic communication port to test the polarity thereof, the polarity tester comprising:

a housing;

a connector supported on the housing and comprising a plurality of electrical contacts, the connector adapted to place the plurality of electrical contacts in electrical connection with a respective plurality of electrical contacts in the communication port when the connector is selectively engaged therewith, the plurality of electrical contacts including a power supply contact and a ground contact;

a conductive path defined within the housing an extending from the power supply contact to the ground contact; and an indicator connected within the conductive path between the power supply contact and arranged to provide to a user of the polarity tester, when the connector is engaged with the communication port, an indication of whether electricity flows into the conductive path from the respective plurality of electrical contacts in the communication port through the power supply contact or through the ground contact.

Preferably the indicator is arranged to provide to the user a confirmatory signal when electricity flows into the conductive path through the ground contact.

Preferably the indicator is arranged to provide to the user a warning signal when electricity flows into the conductive path through the ground contact.

Preferably the indicator is arranged to provide a visual signal to the user of the polarity tester.

Preferably the indicator comprises a light source.

Preferably the indicator comprises a signalling LED, the conductive path connecting an anode of the signalling LED to one of the power supply and ground contacts and connecting a cathode of the signalling LED to an opposite one of the power supply and ground contacts.

Preferably the conductive path connects the anode of the signalling LED to the power supply contact and connects the cathode of the signalling LED to the ground contact.

Preferably the indicator further comprises a second LED connected in parallel with the signalling LED, the conductive path connecting an anode of second LED to the ground contact and connecting a cathode of the second LED to the power supply contact and the signalling and second LEDs being of two distinctive colours. In other words, the indicator may comprise a bi-colour LED connected in the conductive path and arranged to illuminate in a first colour when electricity flows into the conductive path through the power supply contact and illuminate in a second colour, distinct from the first colour, when electricity flows into the conductive path through the ground contact.

Preferably there is provided a resistor connected within the conductive path in series with the indicator.

Preferably the conductive path is defined by a printed circuit board supported within the housing.

Preferably the housing comprises a lid releasably connectable to a main body of the housing in which the conductive path is defined, the connector projecting from the main body for selective covering by the lid.

Preferably the connector is arranged to engage with the communication port only in a predetermined orientation relative thereto.

The connector may comprise a USB connector.

Alternatively, the connector may comprise an IEEE 1394 connector.

Preferably the indicator is mounted within the housing and arranged to provide a visual signal to the user of the connector, the housing defining a viewing path through which the signal is visible.

Preferably at least a portion of the housing comprises material through which the visual signal is visible to the user.

BRIEF DESCRIPTION OF THE DRAWINGS

In the accompanying drawings, which illustrate an exemplary embodiment of the present invention.

DESCRIPTION OF THE PREFERRED EMBODIMENTS

Figure 1:
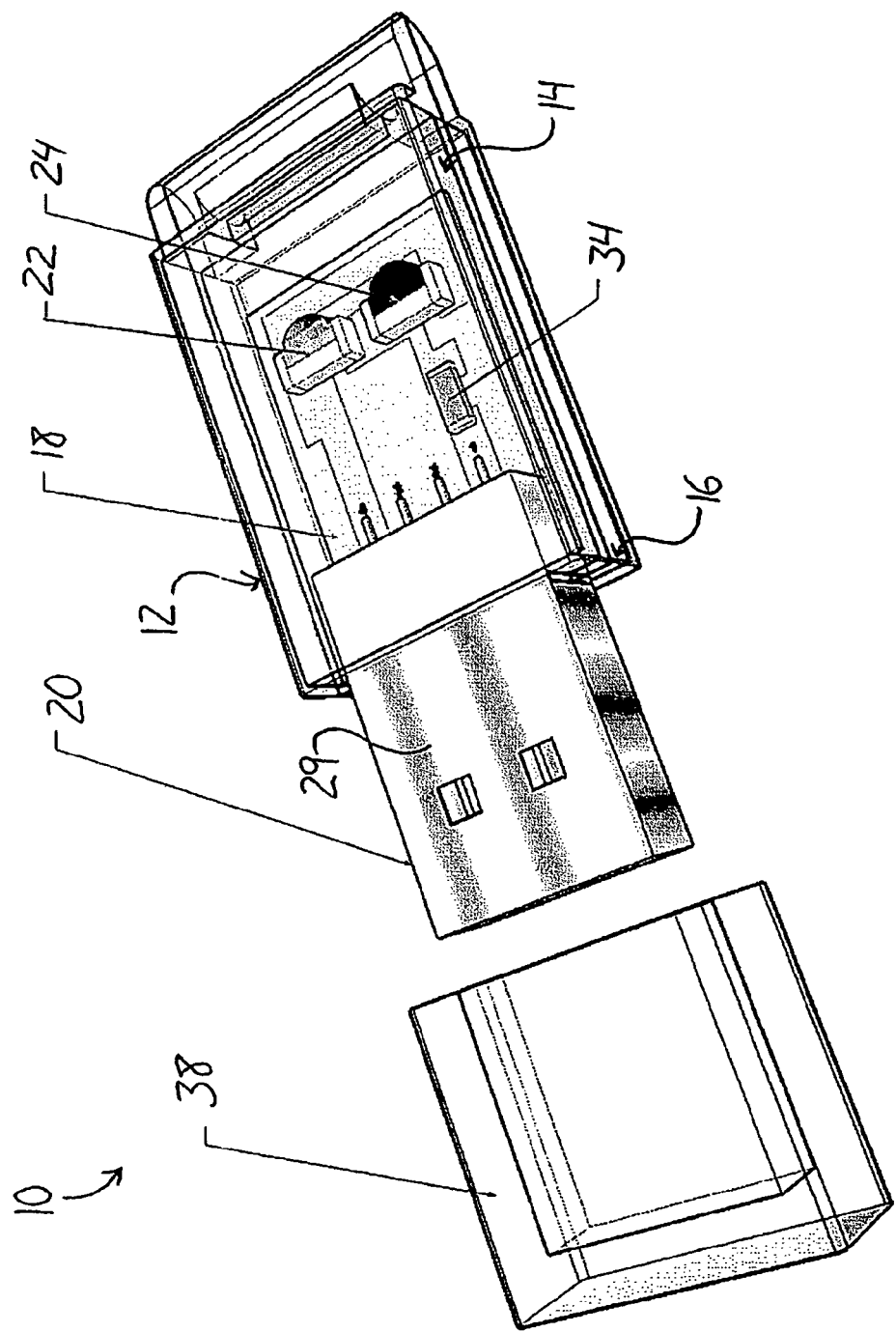
FIG. 1 is a perspective view of a polarity tester according to a first embodiment of the present invention.
Figure 2:
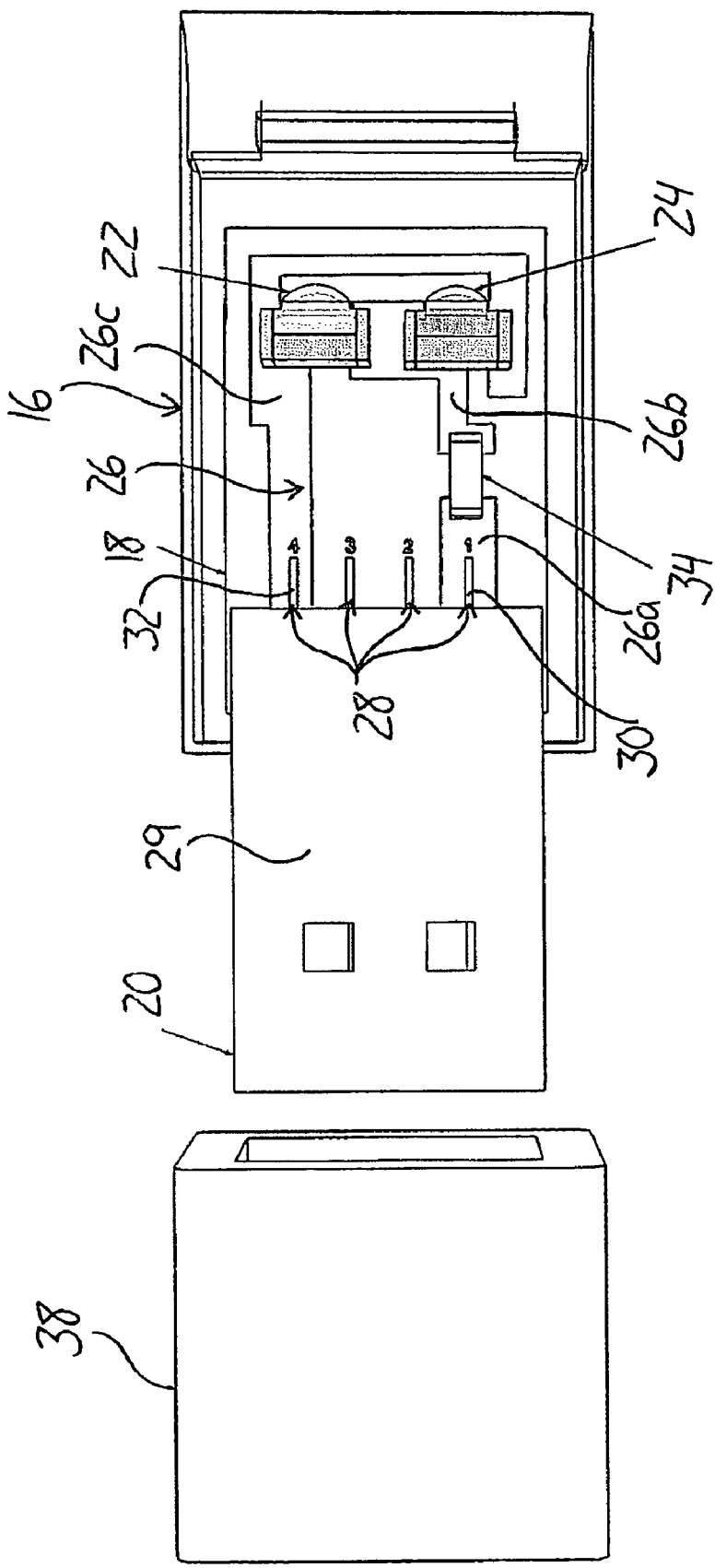
FIG. 2 is a top plan view of the polarity tester of FIG. 1 with an upper half of a housing thereof removed for illustration.

FIGS. 1 and 2 show a first embodiment polarity tester 10 for use with a USB port of a computer. The tester 10 features a plastic housing 12 formed of two shell-like halves 14, 16 engaged together along mating edges defined about the periphery of an open side of each half to enclose a rectangular volume in which a printed circuit board 18 (PCB) is housed. A USB connector 20 projects from the rectangular volume enclosed by the housing halves through an opening defined at one end thereof by two complimentary recesses in the respective end walls of the periphery walls of the two shell-like halves. A green light emitting diode (LED) 22 and a red LED 24 are connected within a conductive path 26 defined on the PCB 18 such that only the green LED will illuminate when the tester 10 is connected to a USB port of proper polarity and only the red LED will illuminate when the tester 10 is connected to a USB port of reversed polarity. The housing 12 is made of transparent plastic to allow a user to see light emitted by each LED through the housing so as to be informed of the ports polarity upon connection of the tester thereto.

The USB connector 20 is a readily available and well-known type A connector having four conductive contacts 28 extending into a protective rectangular sheath 29 closing thereabout. This type of known connector features a plastic tongue (not shown) positioned within the sheath on one side of the plurality of contacts 28 to provide further protection and to cooperate with a corresponding tongue on an opposite side of respective contacts found in the port to define a keyed arrangement whereby the connector can only be received in the port in the proper orientation. Of the plurality of contacts, numbered 1 to 4 on the PCB in the figures, contacts 1 and 4 defined at opposite ends of the one dimensional array of spaced apart parallel contacts extending into the sheath 29 define a power supply contact 30 and a ground contact 32 respectively. A respective one dimensional array of contacts within the port to which the polarity tester 10 is connectable has respective power supply and ground contacts correspondingly disposed at its ends for contact with those of the polarity tester when the connector 20 thereof is engaged with the port. If the port is properly wired to the motherboard's USB header for the correct polarity, the power supply and ground contacts in the port are wired to power supply and ground pins of the header respectively. Otherwise, If improperly wired with the connector inside the computer reversed from its proper orientation, the port will have it's power supply and ground contacts connected to the ground and power supply pins of the USB header respectively, resulting in a polarity at the port opposite that which peripheral equipment is intended to run off of.

On the PCB 18, a first leg 26a of the conductive path 26 connects the power supply contact 30 of the USB connector 20 to a resistor 34, which has its opposite end connected to an anode of the green LED by a second leg 26b of the conductive path 26. A third leg 26c of the conductive path completes connection between the power supply contact 30 and the ground contact 32 by connecting the cathode of the green LED to the ground contact 32. As an LED will only allow current flow through it in one direction, from the anode to the cathode and not vice versa, the green LED 22 will only illuminate if the power supply contact 30 is connected to the power supply pin of the USB header through the power supply contact of the USB port, thereby providing a visual signal to the user that the polarity of the USB port is correct and safe to use with USB compatible peripheral equipment. In other words, the green LED 22 provides an indication that the port polarity is correct and safe to use by illuminating to provide a visual signal confirming proper polarity only when electricity flow enters the conductive path through the power supply contact 30.

The third leg 26c of the conductive path 26 also connects the ground contact 32 to the anode of the red LED 24, and the second leg also connects the cathode of the red LED to the resistor 34. This way, if the polarity of the USB port is reversed from what it should be due to connection of the ground contact in the port with the power supply pin of the header, power supplied through the incorrectly connected ground contact of the port will flow into the polarity tester 10 through the ground contact thereof and illuminate the red LED. In this instance, the green LED will not illuminate, as the third leg 26c of the conductive path connects the ground contact 32 through which power is being supplied to the cathode of the green LED, not the anode, and so current will not pass through the green LED. The red LED 24 thereby provides a visual warning signal to the user that the polarity of the USB port is incorrect and that it thus is not safe to connect peripheral equipment to the port. In other words, the red LED 24 provides an indication that the port polarity is incorrect and unsafe to use by illuminating to provide a visual signal indicative of improper polarity only when electricity flow enters the conductive path through the ground contact 32.

Figure 3:
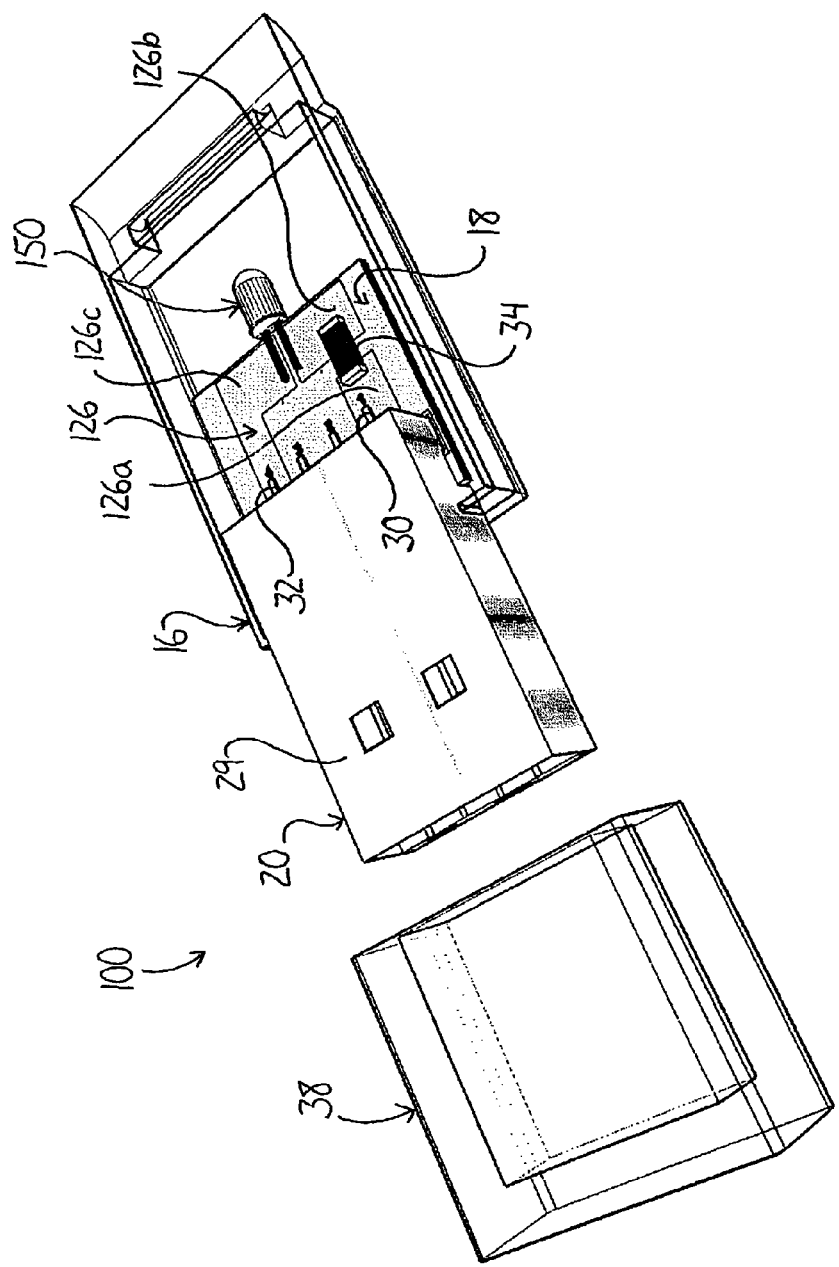
FIG. 3 is a perspective view of a polarity tester according to a second embodiment of the present invention with an upper half of a housing thereof removed for illustration.

A second embodiment polarity tester 100 is shown in FIG. 3. The second embodiment tester 100 differs from the first embodiment tester 10 in that a bi-colour LED unit 150 is used in place of the two separately housed LEDS 22, 24. A bi-colour LED combines two distinctly coloured LEDs within a single unit that illuminates in one of the two possible colours at any one time depending on which direction the electricity flows through it. The conductive path 126 of the second embodiment is thus simplified because the bi-colour LED unit 150 has only two leads, each connected to the anode of one LED and the cathode of the other, so that the second and third legs 126b, 126c of the conductive path need not be directed over the PCB to connect to two distinct LED units. The bi-colour LED 150 will illuminate in green when electricity flows through the conductive path 126 from the power supply contact 30 to the ground contact 32 and will illuminate in red when electricity flows through the conductive path 126 from the ground contact 32 to the power supply contact 30.

Figure 4:
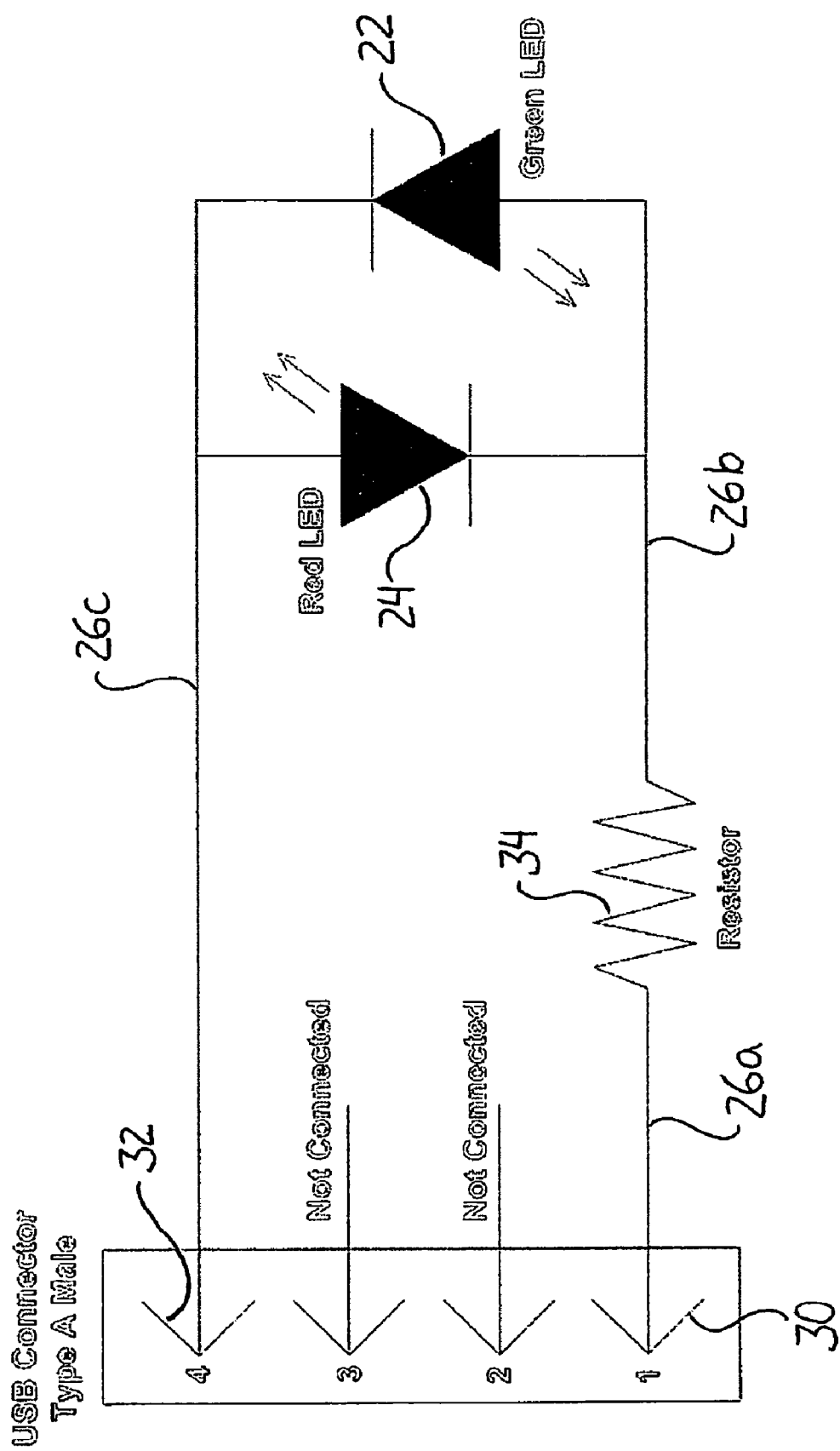
FIG. 4 is a schematic illustration of the first and second embodiment polarity testers.

The schematic illustrations of the polarity tester in FIG. 4 applies to both embodiments, as the whether the two LEDs are provided as separate units or together within a single bi-colour LED unit, the two LEDs are connected in inverse parallel. That is, the two distinctly coloured LEDs are connected with their anodes and cathodes reversed in position between the second and third legs of the conductive path, so that only one will illuminate at any one time, which one being controlled by the direction of current flow. In the plurality of contacts 28 of the USB connector 20, contacts 2 and 3 are not connected to any conductive path of the PCB. The resistor 34 is connected in series with the indicator formed by the pair of LEDs because, as is well-known to those familiar with LEDs, a resistor is needed to limit the current flowing through an LED so that it does not immediately burn out.

As shown in FIG. 1, the housing 12 is made of transparent material so that the upper half 14 of the housing 12 defines a viewing path through which the illumination of either LED is visible by the user of the tester. If the housing material is not at least translucent over some portion thereof to allow visual confirmation of an illuminated LED, then an opening of some type through the housing may instead be provided to allow viewing of the LED indicators. A lid 38 is provided for releasably fitting over and engaging with the portion of the USB connector projecting from the housing 12 against the end of the housing 12 from which the connector projects. The housing 12 and lid 38 shown in the illustrated embodiments are of a conventional structure typically used to similarly support a cooperating USB connector and PCB in small portable USB peripherals such as flash drives and MP3 players, and therefore are not described herein in great detail.

It should be appreciated that the polarity testing device of the present invention would be functional with only a single LED indicator, in which case illumination of the LED would indicate one of either correct or incorrect port polarity, depending on whether the anode is connected to the power supply contact or to the ground contact. Where the single LED is arranged in the conductive path to illuminate when electricity enters the conductive path through the ground contact (improper polarity conditions), then a lack of illumination of the LED with the USB connector engaged in the port would indicate electricity entering the conductive path through the power supply contact and thus proper polarity. However, as the use of two distinctly coloured LEDs to provide distinct visual signals for the two possible conditions of the port polarity avoids the use of a lack of signal from as an indicator to the user, the likelihood of a misinterpretation due to a burnt out LED is less likely. For example, in a one LED embodiment it would be necessary to disconnect the port from the motherboard's USB header and reconnect it in the opposite orientation and retest the port to confirm the correct interpretation of a "no illumination" reading with the tester. Only if the LED illuminated during the retest would the user know that the indication given by the first test was accurate. The embodiments described above illuminating in green when polarity is correct and in red when incorrect also make use of the common association of green with "safe" or "proceed" and red with "stop" or "caution" from the context of traffic control lights.

It should be appreciated that other colours may be used, and that the indicator used should not be limited to light emitting diodes. For example, another type of light source, an audible alarm or even a display screen programmed to display the polarity status could be connected in series with a diode, the diode allowing current flow in only one direction through it and thereby limiting actuation of the non-LED indicator to conditions where current flows through the diode. It should also be appreciated that the polarity tester may be modified to have a different connector for use with another type of communication port, for example an IEEE 1394 port and that the conductive connections between the contacts and the indicator components need not necessarily by provided by a printed circuit board.

Since various modifications can be made in my invention as herein above described, and many apparently widely different embodiments of same made within the spirit and scope of the claims without department from such spirit and scope, it is intended that all matter contained in the accompanying specification shall be interpreted as illustrative only and not in a limiting sense.

The invention claimed is:

1. A polarity tester engagable with an electronic communication port to test the polarity thereof, the polarity tester comprising:
   a housing;
   a connector supported on the housing and comprising a plurality of electrical contacts and a sheath closing around the plurality of electrical contacts, the connector being adapted to place the plurality of electrical contacts in electrical connection with a respective plurality of electrical contacts in the communication port when the connector is selectively engaged therewith, the plurality of electrical contacts including a power supply contact and a ground contact;
   a conductive path defined within the housing an extending from the power supply contact to the ground contact; and
   an indicator connected within the conductive path between the power supply contact and the ground contact, and arranged to provide to a user of the polarity tester, when the connector is engaged with the communication port, an indication of whether electricity flows into the conductive path from the respective plurality of electrical contacts in the communication port through the power supply contact.

2. The polarity tester according to claim 1 wherein the indicator is arranged to provide to the user a confirmatory signal when electricity flows into the conductive path through the ground contact.

3. The polarity tester according to claim 1 wherein the indicator is arranged to provide to the user a warning signal when electricity flows into the conductive path through the ground contact.

4. The polarity tester according to claim 1 wherein the indicator is arranged to provide a visual signal to the user of the polarity tester.

5. The polarity tester according to claim 1 wherein the indicator comprises a light source.

6. The polarity tester according to claim 1 wherein the indicator comprises a signalling LED, the conductive path connecting an anode of the signalling LED to one of the power supply and ground contacts and connecting a cathode of the signalling LED to an opposite one of the power supply and ground contacts.

7. The polarity tester according to claim 6 wherein the conductive path connects the anode of the signalling LED to the power supply contact and connects the cathode of the signalling LED to the ground contact.

8. The polarity tester according to claim 7 wherein the indicator further comprises a second LED connected in parallel with the signalling LED, the conductive path connecting an anode of second LED to the ground contact and connecting a cathode of the second LED to the power supply contact and the signalling and second LEDs being of two distinctive colours.

9. The polarity tester according to claim 1 wherein the indicator comprises a bi-colour LED connected in the conductive path and arranged to illuminate in a first colour when electricity flows into the conductive path through the power supply contact and illuminate in a second colour, distinct from the first colour, when electricity flows into the conductive path through the ground contact.

10. The polarity tester according to claim 6 further comprising a resistor connected within the conductive path in series with the indicator.

11. The polarity tester according to claim 1 wherein the conductive path is defined by a printed circuit board supported within the housing.

12. The polarity tester according to claim 1 wherein the housing comprises a lid releasably connectable to a main body of the housing in which the conductive path is defined, the connector projecting from the main body for selective covering by the lid.

13. The polarity tester according to claim 1 wherein the connector is arranged to engage with the communication port only in a predetermined orientation relative thereto.

14. The polarity tester according to claim 1 wherein the connector comprises a USB connector.

15. The polarity tester according to claim 1 wherein the connector comprises an IEEE 1394 connector.

16. The polarity tester according to claim 1 wherein the indicator is mounted within the housing and arranged to provide a visual signal to the user of the connector, the housing defining a viewing path through which the signal is visible.

17. The polarity tester according to claim 16 wherein at least a portion of the housing comprises material through which the visual signal is visible to the user.

18. The polarity tester according to claim 1 comprising a tongue positioned within the sheath to form a key for determining a proper orientation in which the connector can be received in the communication port.

* * * * *